United States Patent
Hwang et al.

(10) Patent No.: US 6,489,250 B1
(45) Date of Patent: Dec. 3, 2002

(54) METHOD FOR CUTTING GROUP III NITRIDE SEMICONDUCTOR LIGHT EMITTING ELEMENT

(75) Inventors: Rong-Yih Hwang, Hsin Chu Hsien (TW); Charng-Shyang Jong, Hsin Chu (TW); Tzer-Perng Chen, Hsin Chu (TW)

(73) Assignee: United Epitaxy Company Ltd., Hsinchu (TW)

( * ) Notice: Subject to any disclaimer, the term of this patent is extended or adjusted under 35 U.S.C. 154(b) by 0 days.

(21) Appl. No.: 09/716,296

(22) Filed: Nov. 21, 2000

(51) Int. Cl.$^7$ ............................................. H01L 21/302

(52) U.S. Cl. ........................ 438/745; 438/750; 438/751

(58) Field of Search ................................ 438/745, 750, 438/751, 33, 34, 42, 46

(56) References Cited

U.S. PATENT DOCUMENTS

| | | | | |
|---|---|---|---|---|
| 4,613,417 A | * | 9/1986 | Laskoski et al. | 204/129.85 |
| 5,300,788 A | * | 4/1994 | Fan et al. | 257/13 |
| 6,083,769 A | * | 7/2000 | Kurahashi | 438/33 |
| 6,110,277 A | * | 8/2000 | Braun | 117/94 |

* cited by examiner

*Primary Examiner*—Robert Kunemund
*Assistant Examiner*—Lan Vinh
(74) *Attorney, Agent, or Firm*—Rosenberg, Klein & Lee

(57) ABSTRACT

A method for cutting Group III nitride semiconductor light emitting element comprises the step of discharge-etched on a front face of a chip or cutting channel of a substrate; and breaking on a back surface of the discharge-etching face to be formed with dies. This method is different from the prior art dicing saw and point scribe. Thus, the cutting time is shortened. The consumption of the diamond knife from cutting is reduced. The yield ratio of dies is improved and the outlook is also improved.

3 Claims, 6 Drawing Sheets

METHOD FOR CUTTING GROUP III NITRIDE SEMICONDUCTOR LIGHT EMITTING ELEMENT

FIELD OF THE INVENTION

The present invention relates to a field of cutting a semiconductor light emitting element, and especially to a method for cutting Group III nitride semiconductor light emitting element, thereby, the cutting time is shortened; the consumption of the diamond knife from cutting is reduced; the yield ratio of dies is improved and the outlook is also improved.

BACKGROUND OF THE INVENTION

The prior art method for cutting Group III nitride semiconductor light emitting element is to perform a dicing saw on the front face of a chip to a depth of several micrometer and then to scribe at a back surface of a chip so that the die can be broken out.

However, dicing saw is a time-consuming process and the cutting depth is confined by the diamond knife, thus the speed is also confined. And, III family nitride semiconductor light emitting element the cost is increased.

Next, the die can not be striped according to scribing lines since the scribe depth is insufficient and the front face of the chip has no effective breaking factor so that the shape of the die is not good.

Therefore, there is an eager demand for a novel method which is different from the prior art dicing saw and point scribe.

SUMMARY OF THE INVENTION

Accordingly, the primary object of the present invention is to provide a method for cutting Group III nitride semiconductor light emitting element comprising the step of: discharge-etched on a front face of a chip or cutting channel of a substrate; and breaking on a back surface of the discharge-etching face to be formed with dies.

Another object of the present invention is to provide a method for cutting Group III nitride semiconductor light emitting element comprising the step of: discharge-etched on a front face of a chip or cutting channel of a substrate; performing a dicing saw or point scribe process on the discharge-etching face; and breaking on a back surface of the discharge-etching face to be formed with dies.

A yet object of the present invention is to provide a method for cutting Group III nitride semiconductor light emitting element. Since the cutting line of a chip is performed by discharge-etching. Since discharge-etching is used to be formed with the cutting line of a chip, the etching is performed to a sapphire substrate which is difficult to be cut, and has a preferred effect.

A yet object of the present invention is to provide a method for cutting Group III nitride semiconductor light emitting element comprises the step of discharge-etched on a front face of a chip or cutting channel of a substrate; and breaking on a back surface of the discharge-etching face to be formed with dies. This method is different from the prior art dicing saw and point scribe. Thus, the cutting time is shortened. The consumption of the diamond knife from cutting is reduced. The yield ratio of dies is improved and the outlook is also improved.

The various objects and advantages of the present invention will be more readily understood from the following detailed description when read in conjunction with the appended drawing.

DETAILED DESCRIPTION OF THE PREFERRED EMBODIMENTS

Figure 1:
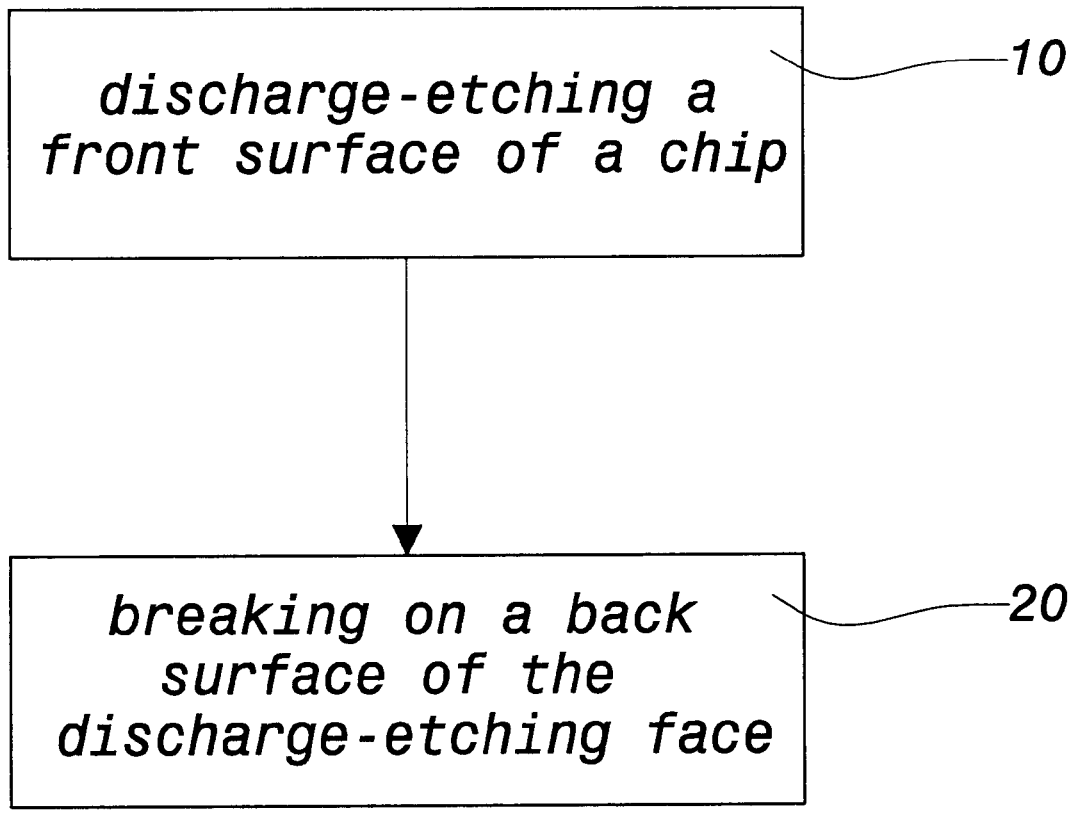
FIG. 1 is a flow diagram of the discharge-etching in the present invention.
Figure 2A:
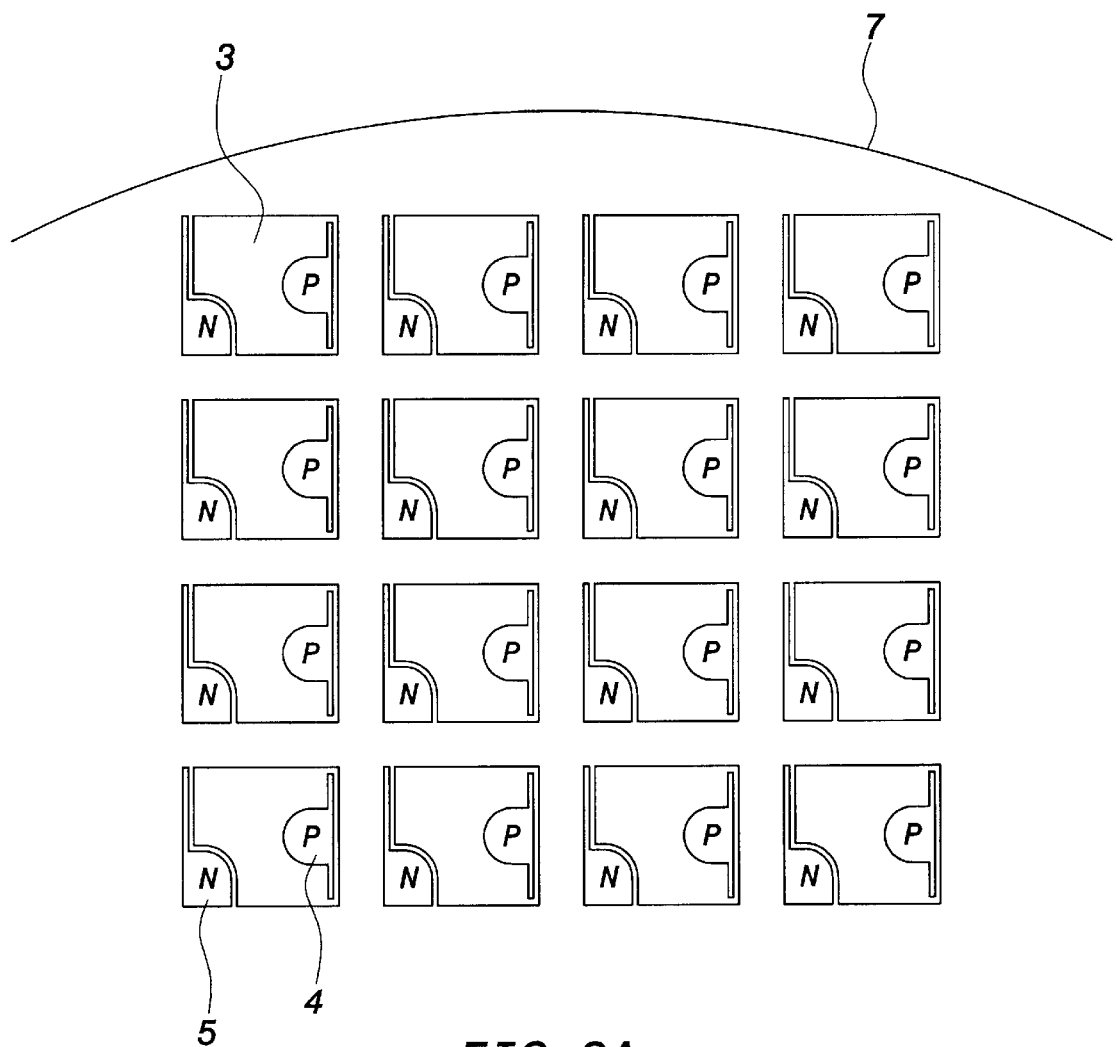
FIG. 2A is an upper view of the front face of the chip before being cut according to the present invention.
Figure 2B:
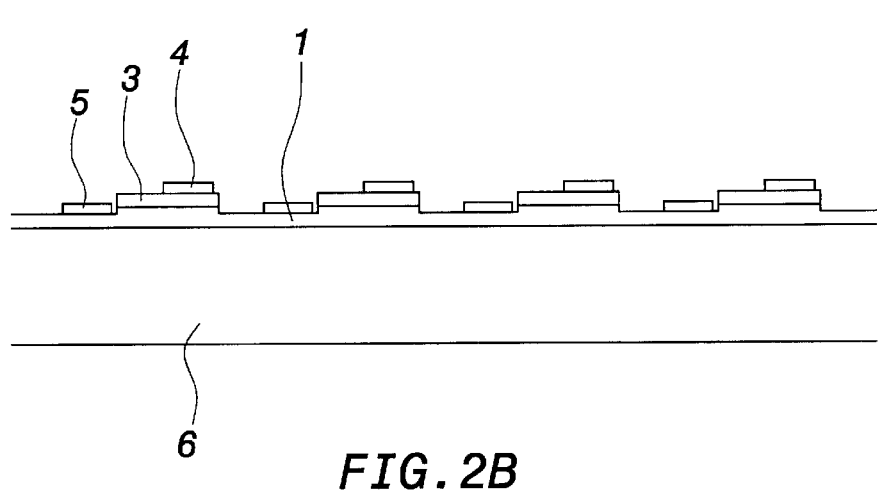
FIG. 2B is a lateral view of the front face of the chip before being cut according to the present invention
Figure 3A:
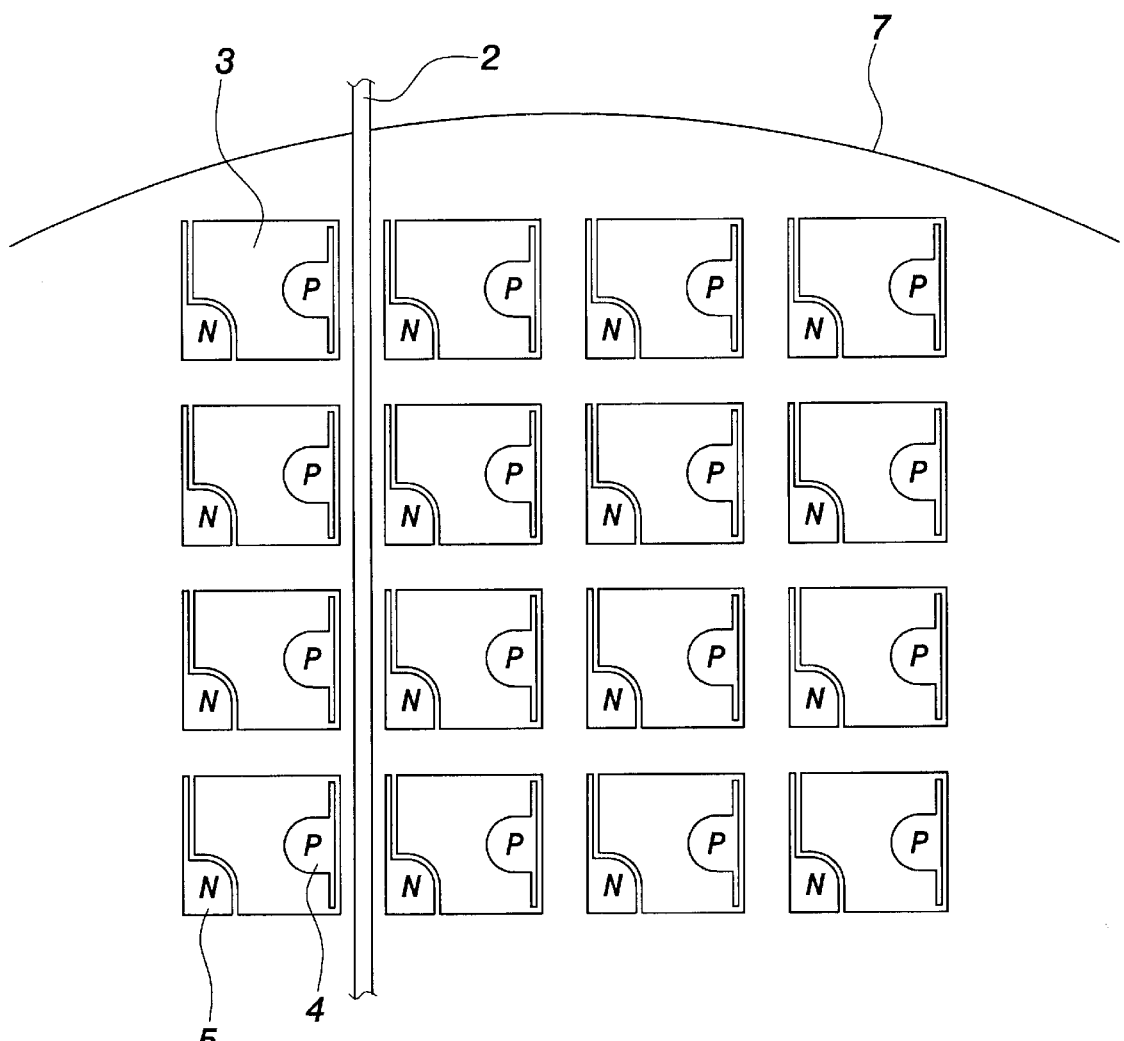
FIG. 3A is an upper view showing the discharge-etching along a cutting channel on a front face of a chip according to the present invention.
Figure 3B:
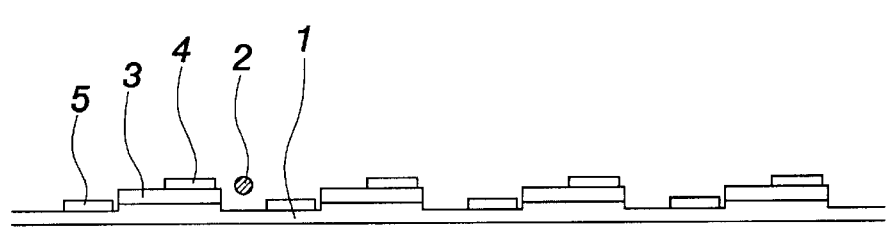
FIG. 3B is a lateral view showing the discharge-etching along a cutting channel on a front face of a chip according to the present invention.
Figure 4A:
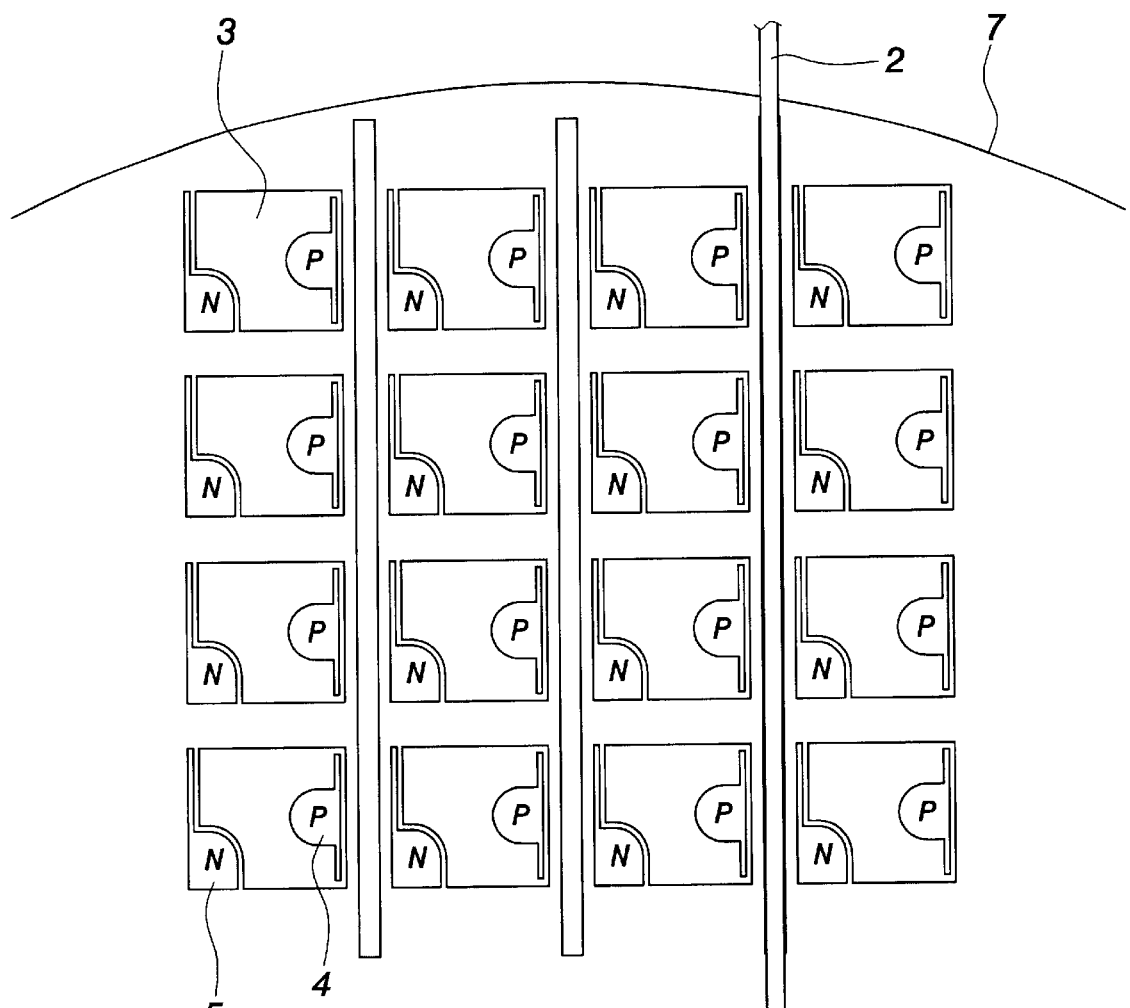
FIG. 4A is an upper view showing discharge-etching along a vertical cutting channel on a front surface of a chip to the substrate according to the present invention.
Figure 4B:
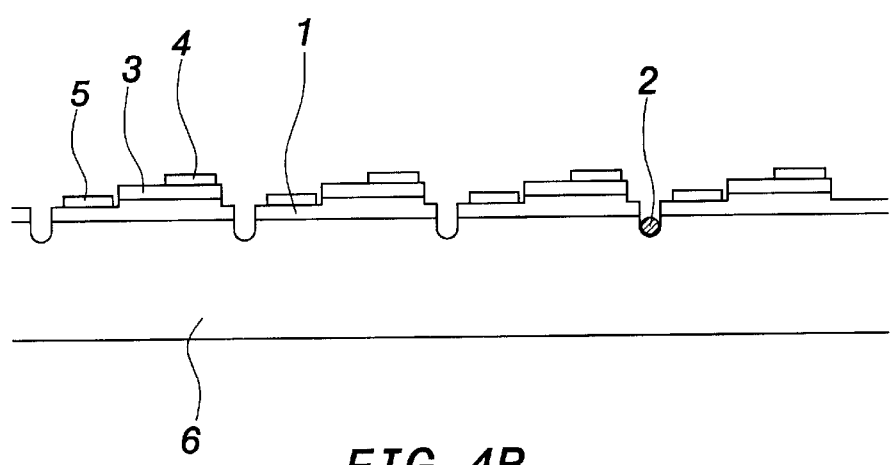
FIG. 4B is a lateral view showing discharge-etching along a vertical cutting channel on a front surface of a chip to the substrate according to the present invention.

With reference to FIG. 1, a discharging and etching method for cutting light emitting diode die of the present invention is illustrated. In that method, the front surface of the chip is discharge-etched along a cutting channel (step 10). The etching can be into the substrate as desired. Then, a break step is performed at a back surface of the discharge-etching surface to strip as dies.

Figure 5A:
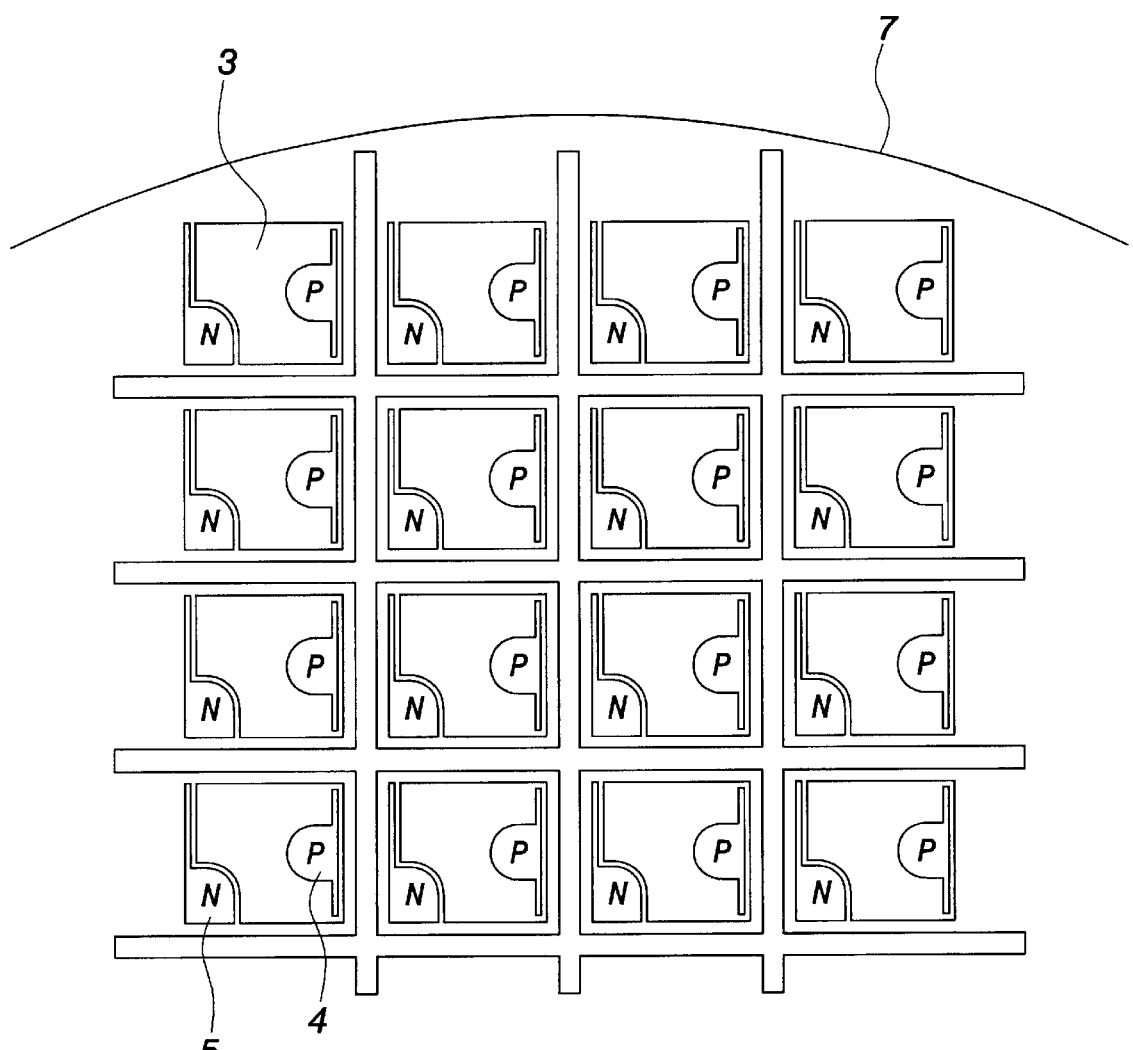
FIG. 5A is an upper view showing discharge-etching along a horizontal cutting channel on a front surface of a chip to the substrate according to the present invention.
Figure 5B:
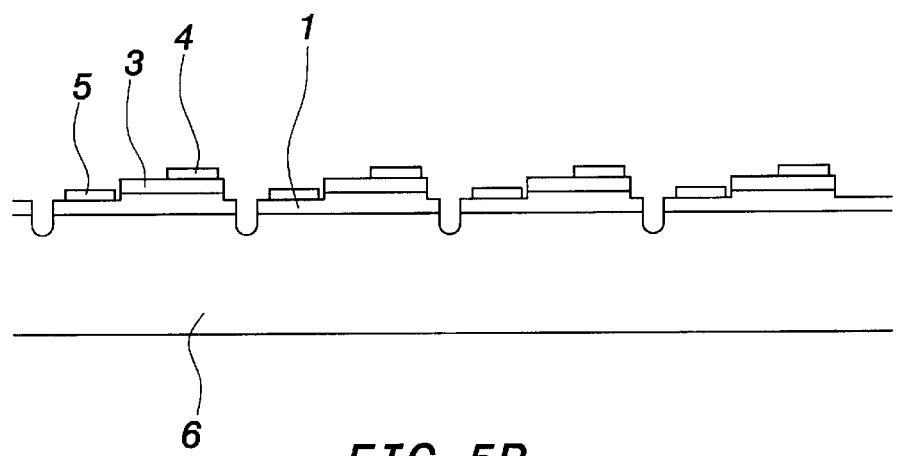
FIG. 5B is a lateral view showing discharge-etching along a horizontal cutting channel on a front surface of a chip to the substrate according to the present invention.

Referring to FIG. 2A to FIG. 5A, the embodiment of the present invention is illustrated. In a front surface of an uncut chip 7, the cutting channel is discharge-etched. The discharge-etching way is performed by applying a proper current through a metal line and a proper etching solution is used to line-etching on a surface of the chip 7, as shown in FIGS. 3A and 3B to properly control the distance of the metal line 2 from the surface of the chip 7 to the substrate in order to control the etching depth. Then, the etching in the vertical direction can be complete sequentially, as shown in FIGS. 4A and 4B. Then, the cutting channel is discharge-etched in the horizontal direction, as shown in FIGS. 5A and 5B. After the discharge-etching on the front surface is complete, a break step is performed on the back surface of the chip 7 so as to be formed with dies.

A plurality of dies 3 are layout on the chip 7. The dies 3 are retained with a proper distance to one another. Each die 3 is installed with a P electrode 4 and an N electrode 5.

Figure 6:
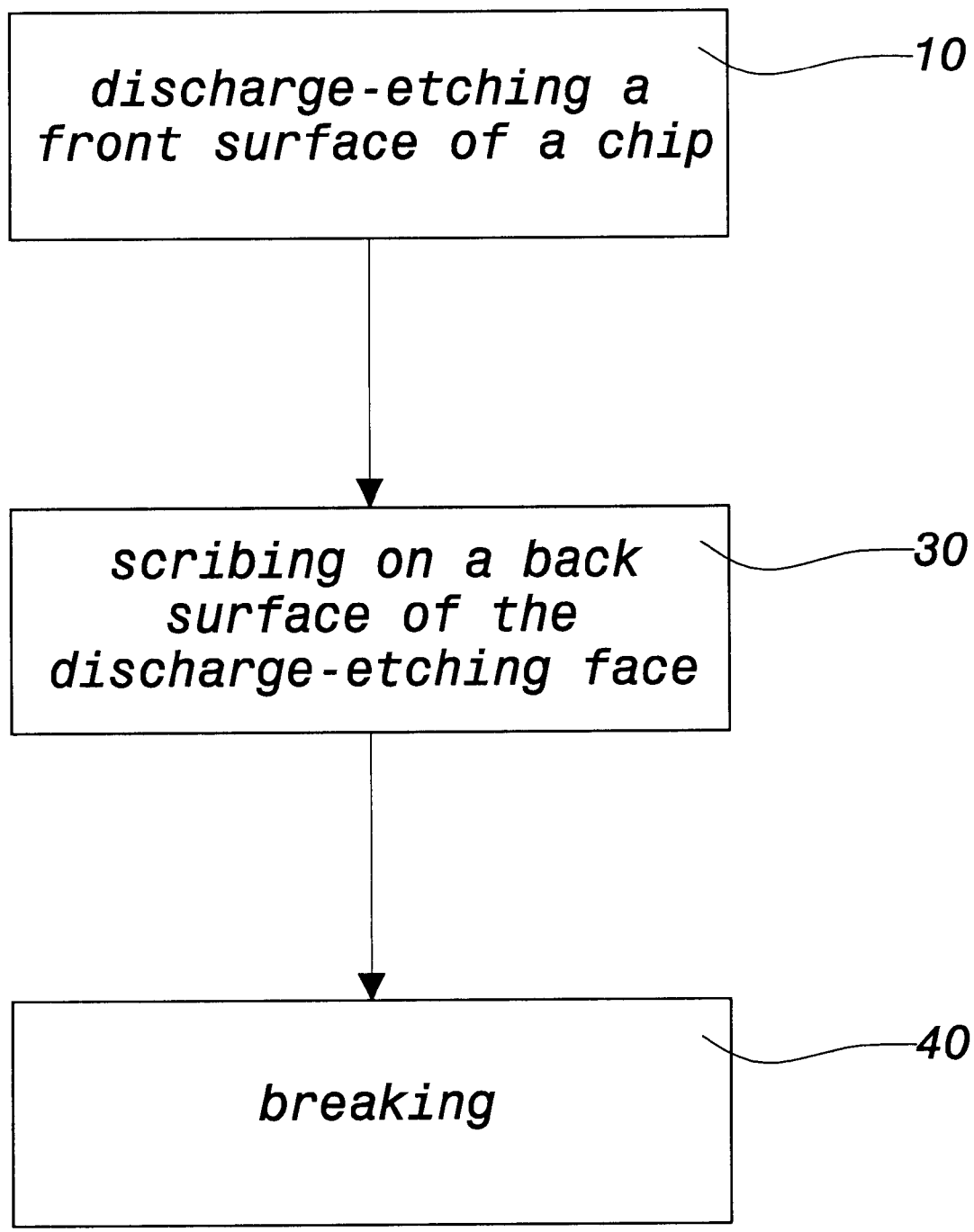
FIG. 6 is a flow diagram of the discharge-etched in the present invention.

Referring to FIG. 6, in the present invention, after the manufacturing process (10) of discharge-etching in the front surface is complete, a diamond scribe on the back surface of the discharge-etching surface (step 30), and then a break process is performed (step 40) for enhancing the effect.

Besides, the chip of the present invention may be an epitaxial chip which does not enter into a manufacturing process. After the cutting channel discharge-etching process is accomplished, the following process is performed.

In summary, the discharge-etching process of the present invention has the following advantages:

1. The cutting time is shortened.
2. The consumption of the diamond knife from cutting is reduced.
3. The yield ratio of dies is improved and the outlook is also improved.
4. The substrate difficult to be cut can be etched for achieving a preferred cutting effect.

Therefore, the present invention has the utility, which is different from the general dicing saw and point scribe.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A method for separation of at least one light emitting element from a wafer having opposing front and back surfaces, comprising the steps of:

(a) extending in a first direction at least one metal line at a predetermined position above said front surface of said wafer adjacent said at least one light emitting element;

(b) applying an etching solution to said front surface of said wafer;

(c) applying electrical current to said at least one metal line;

(d) displacing said at least one metal line from said predetermined position thereof to control an etching depth of a material of said wafer for forming at least one separation channel in said front surface of said wafer;

(e) extending in a second direction at least one metal line at a predetermined position above said front surface of said wafer adjacent said at least one light emitting element, said second direction being substantially orthogonal said first direction;

(f) repeating said steps (b) through (d); and, (g) separating said at least one light emitting element from said wafer.

2. The method of claim 1, wherein said at least one light emitting element includes Group III nitride semiconductor compound.

3. The method of claim 1, further comprising the step of:

forming a respective groove on a back surface of said wafer in substantial alignment with each of said separation channels formed on said front surface of said wafer, the step of separating said at least one light emitting element from said wafer includes breaking said wafer along said grooves from said back side.

* * * * *